United States Patent [19]
Koizumi et al.

[11] Patent Number: 5,342,654
[45] Date of Patent: Aug. 30, 1994

[54] SURFACE ROUGHENING OF RESIN MOLDED ARTICLES FOR METALLIZING

[75] Inventors: Tomoyoshi Koizumi; Yukio Ichikawa, both of Fukushima, Japan

[73] Assignee: Kureha Kagaku Kogyo Kabushiki Kaisha, Tokyo, Japan

[21] Appl. No.: 900,467

[22] Filed: Jun. 18, 1992

[30] Foreign Application Priority Data

Jun. 19, 1991 [JP] Japan ................... 3-147288

[51] Int. Cl.$^5$ .............................. B05D 3/10
[52] U.S. Cl. .................. 427/307; 156/654; 156/668; 427/304; 427/305; 427/306
[58] Field of Search ............... 427/304–307, 427/444; 156/654, 668

[56] References Cited

U.S. PATENT DOCUMENTS

| 4,460,747 | 7/1984 | Horak et al. ............ 427/307 |
| 4,486,463 | 12/1984 | Rubner et al. ............ 427/307 |
| 4,532,015 | 7/1985 | Boultinghouse et al. ............ 427/307 |
| 4,803,097 | 2/1989 | Fraenkel et al. ............ 427/307 |
| 4,917,761 | 4/1990 | Keep ............ 427/307 |
| 4,950,360 | 8/1990 | Murao et al. ............ 427/307 |
| 4,997,724 | 3/1991 | Suzuki et al. ............ 428/626 |

FOREIGN PATENT DOCUMENTS

| 0326918 | 8/1989 | European Pat. Off. . |
| 0347062 | 12/1989 | European Pat. Off. . |
| 3901029 | 7/1990 | Fed. Rep. of Germany . |

OTHER PUBLICATIONS

Patent Abstracts of Japan, vol. 11, No. 262, Aug. 25, 1987, p. 91 C 442.

*Primary Examiner*—Janyce Bell
*Attorney, Agent, or Firm*—Sughrue, Mion, Zinn, Macpeak & Seas

[57] ABSTRACT

A method for roughening the surface of a resin molded article to make it susceptible to metallizing is disclosed, comprising contacting a resin molded article at least the surface of which to be toughened mainly comprises a block copolymer comprising 100 parts by weight of a polyphenylene sulfide resin and from 30 to 100 parts by weight of a polyphenylene sulfide ketone resin with a solvent capable of dissolving a polyphenylene sulfide ketone resin more than a polyphenylene sulfide resin.

3 Claims, No Drawings

SURFACE ROUGHENING OF RESIN MOLDED ARTICLES FOR METALLIZING

FIELD OF THE INVENTION

This invention relates to a method for roughening the surface of a polyphenylene sulfide resin (hereinafter abbreviated as PPS) molded article to render the same susceptible to metallizing.

BACKGROUND OF THE INVENTION

With the recent demands for size and weight reductions of parts, metallizing of PPS molded articles is acquiring importance in the fields of substitutes for metals, printed circuit boards, condensers, etc.

There have been proposed many methods for surface toughening preceding metallizing of PPS molded articles, but the particular method according to the present invention is unknown.

SUMMARY OF THE INVENTION

An object of the present invention is to provide a novel method for surface roughening of PPS molded articles.

The concept of the present invention resides in incorporation of a specific resin into PPS and dissolving the specific resin on the surface of a molded article obtained with a specific solvent capable of dissolving said specific resin but incapable or sparingly capable of dissolving PPS thereby achieving surface roughening as a pretreatment of metatlizing. However, as exemplified by Comparative Example 3 hereinafter given, even when a resin molded article comprising PPS and a certain resin is treated with a solvent capable of dissolving such a certain resin but incapable of dissolving PPS, some cases are met in which metallizing on the treated surface cannot be achieved. Hence, it was not easy to find out such a specific resin to be incorporated into PPS.

The present invention relates to a method for toughening the surface of a resin molded article to make it susceptible to metallizing, which comprises contacting a resin molded article at least the surface of which to be roughened comprises 100 parts by weight of PPS and from 30 to 100 parts by weight of a polyphenylene sulfide ketone resin (hereinafter abbreviated as PPSK) with a solvent capable of dissolving PPSK more than PPS.

DETAILED DESCRIPTION OF THE INVENTION

The molded article to be roughened and metallized should have a composition comprising PPS and PPSK on at least the surface portion thereof to be roughened and metallized. The part of the molded article which is not to be metallized does not need to have such a composition. For example, the inner part of the molded article may comprise a different material(s), such as a glass mat.

PPS which can be used in the present invention includes a homopolymer comprising a p-phenylene sulfide monomer unit represented by formula:

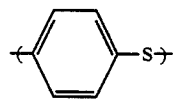

and a copolymer comprising at least 50 mol %, preferably at least 70 mol %, and more preferably at least 90 mol %, of the p-phenylene sulfide monomer unit.

Comonomer units in the copolymer PPS include, an m-phenylene sulfide unit of formula:

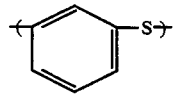

a diphenyl ether sulfide unit, a biphenyl sulfide unit, and a 2,6-naphthalene sulfide unit. The copolymer form is not particularly limited and may be a random copolymer or a block copolymer.

PPS can be prepared by any process. For example, the processes disclosed in U.S. Pat. No. 3,354,129, JP-B-52-12240, JP-B-63-337775, and JP-A-61-14228 (the term "JP-B" means an "examined published Japanese patent application", and the term "JP-A" means an "unexamined published Japanese patent application") can be employed.

The degree of polymerization of PPS is not particularly critical, but PPS preferably has a melt viscosity of from 1 to 100,000 poise, and particularly from 5 to 10,000 poise. The terminology "melt viscosity" as referred to herein is a value obtained by preheating pelletized PPS at 310° C. for 5 minutes in a capillary rheometer "Capillograph" manufactured by Toyo Seiki Seisakusho K.K. and extruding the molten resin from a capillary having a diameter of 1 mm and a height of 10 mm at a shear rate of 1200 s$^{-1}$.

PPSK which can be used in the present invention includes a homopolymer comprising a repeating unit represented by formula:

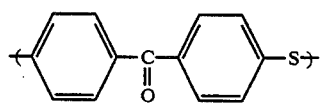

and a copolymer comprising at least 50 mol %, preferably at least 70 mol %, and more preferably at least 90 mol %, of the repeating unit. Examples of usable comonomer units in the case of a PPSK copolymer are the same as in the copolymer PPS. It should be noted, however, that a comonomer unit forming a crosslinking structure is unfavorable because such makes the subsequent solvent treatment difficult.

At least the surface portion to be roughened of the molded article comprises 100 parts by weight of PPS and from 30 to 100 parts by weight, preferably from 40 to 90 parts by weight, of PPSK. If desired, the surface portion to be roughened may further contain other compounding additives. If the PPSK content is less than 30 parts per 100 parts of PPS, toughening cannot be sufficiently carried out. If it exceeds 100 parts, roughening becomes excessive. In either case, adhesion to a metallic deposit is reduced.

Methods of molding the resin composition comprising PPS and PPSK are not particularly limited, and molding techniques generally employed for PPS, such as injection molding, extrusion, compression molding, blow molding, and the like, can be used.

The thus obtained molded article is preferably subjected to degreasing before contact with a solvent. Degreasing is usually carried out by dipping the molded article in an alkali rinsing solution at pH 10 to 12 preferably while applying ultrasonic waves, followed by washing with water and drying.

The degreased molded article is then brought into contact with a solvent capable of dissolving PPSK more than PPS. Such a solvent preferably includes concentrated sulfuric acid, methanesulfonic acid, trifluoromethanesulfonic acid, and trichloromethanesulfonic acid.

The contact between the surface to be roughened and the solvent is preferably effected by dipping. The contact may be effected by spraying or coating of the solvent. Dipping is preferably performed with stirring by means of, for example, an ultrasonic vibration apparatus. The contact is conducted at room temperature or, if necessary, under heating. The contact time is selected appropriately depending on various conditions, such as the PPS to PPSK ratio on the surface portion, the kind of the solvent used, the stirring condition, and so on.

The roughened surface is usually washed with water and dried before metallizing. Metallizing can be carried out in a known manner. For example, the surface is treated with a strong acid solution containing an oxidizing agent, followed by electroless plating or a combination of electroless plating and electroplating, sputtering, or vacuum deposition. The effects of the present invention are particularly significant in metallizing by electroless plating or a combination of electroless plating and electroplating.

With the composition of the surface portion to be toughened falling within the above-described range, PPSK on the surface is dissolved by a solvent capable of dissolving PPSK more than PPS, such as concentrated sulfuric acid, resulting in formation of a properly roughened surface. Metallizing on such a toughened surface provides a deposited metal film excellent in adhesion to PPS.

The present invention is now illustrated in greater detail with reference to Examples, but it should be understood that the present invention is not construed as being limited thereto. All the parts, percents, and ratios are given by weight unless otherwise indicated.

In Examples, plate adhesion of the plated (metallized) resin article was evaluated according to the following test method.

Plate Adhesion

Plate adhesion was tested by peel test using an adhesive cellophane tape substantially according to JIS K5400. The deposited metal film of a plated molded article is crosshatched with a cutter to make 100 1-by-1 mm squares, and an adhesive cellophane tape is sufficiently adhered on the squares to an adhesion length of about 50 mm. Two minutes later, one end of the adhesive tape is rapidly peeled at a peel angle of 90°. The condition of the metal film remaining on the resin molded article is observed and rated according to the following standards.

10 Every scratch is narrow and smooth, and none of the squares undergoes peeling even at the corners.

8 The total peeling area is within 5% of the total square area.

6 The total peeling area is from 5 to 15% of the total square area.

4 The total peeling area is from 15 to 35% of the total square area.

2 The total peeling area is from 35 to 65% of the total square area.

0 The total peeling area is 65% or more of the total square area.

EXAMPLE 1

A resin composition comprising 100 parts of a p-phenylene sulfide homopolymer (produced by Kureha Kagaku Kogyo K.K.; melt viscosity: 1400 poise) and 43 parts of PPSK (inherent viscosity: 0.63 dl/g at 23° C. in concentration of 0.4 g/dl) in 98% concentrated sulfuric acid as a solvent was extruded through a T-die. The extruded sheet was cut to a test specimen of 100 mm in width, 100 mm in length, and 100 $\mu$m in thickness.

The specimen was heated in air at 150° C. for 30 minutes to crystallize the resin and then dipped in an alkali rinsing liquid ("EXTRANMA01" produced by Merck Japan, 10-fold diluted with distilled water) for 5 minutes with ultrasonic vibration for degreasing. The specimen was washed with distilled water for 5 minutes with ultrasonic vibration and dried. The specimen was further dipped in a 98% sulfuric acid solution at room temperature for 10 minutes while applying ultrasonic vibration to conduct surface roughening.

In 10 ml of a 35% hydrochloric acid aqueous solution were dissolved 0.05 g of $PdCl_2$ and 0.5 g of $SnCl_2$, and 10 ml of water was added thereto. The specimen having a roughened surface was soaked in the thus prepared aqueous solution for 15 minutes while maintaining the solution at 30° C. for surface activation. After washing with distilled water for 5 minutes, the specimen was dipped in an aqueous solution containing 56 g of $CuSO_4$, 1.0 g of NaOH, 5.0 g of $NaKC_4O_6$, 1.0 ml of a 40% formaldehyde aqueous solution, and 39 ml of water for 20 minutes at a temperature controlled to 0° C. to conduct copper plating.

As a result of peel test, the plate adhesion was rated "10".

EXAMPLE 2

The same procedure as in Example 1 was repeated, except for using 67 parts of PPSK per 100 parts of PPS. The plate adhesion of the plated resin molded article was rated "10".

EXAMPLE 3

Eighty-two parts of PPSK and 120 parts of glass fibers were mixed with 100 parts of PPS, and the resulting resin composition was injection molded to obtain a specimen 20 mm wide, 100 nun long, and 4 mm thick. Surface toughening and metallizing of the specimen were conducted in the same manner as in Example 1. The plate adhesion was rated "10".

EXAMPLE 4

The same procedure as in Example 2 was repeated, except for replacing concentrated sulfuric acid for toughening with trifluoromethanesulfonic acid. The plate adhesion was rated "10".

COMPARATIVE EXAMPLE 1

The same procedure as in Example 1 was repeated, except for using no PPSK. The plate adhesion of the plated resin molded article was rated "0".

COMPARATIVE EXAMPLE 2

The same procedure as in Example 1 was repeated, except for using 11 parts of PPSK per 100 parts of PPS. The plate adhesion of the plated resin molded article was rated "0".

COMPARATIVE EXAMPLE 3

The same procedure as in Example 2 was repeated, except for replacing PPSK with polystyrene and replacing concentrated sulfuric acid for roughening with toluene. The plate adhesion was rated "0".

EXAMPLE 5

The same procedure as in Example 1 was repeated, except for replacing the electroless copper plating by metal coating by means of an ion sputter ("E-101 Model" manufactured by Hitachi Naka Seiki K.K.). Sputtering was carried out at a degree of vacuum of 0.05 Torr and at an ionizing current of 15 mA for 4 minutes. The plate adhesion was rated "10".

EXAMPLE 6

The same procedure as in Example 2 was repeated, except for replacing the electroless copper plating by metal coating by means of an ion sputter ("E-101 Model" manufactured by Hitachi Naka Seiki K.K.). Sputtering was carried out at a degree of vacuum of 0.05 Torr and at an ionizing current of 15 mA for 4 minutes. The plate adhesion was rated "10".

EXAMPLES 7 AND 8 AND COMPARATIVE EXAMPLES 4 AND 5

The same procedure as in Example 1 was repeated, except for using 35 parts (Example 7), 95 parts (Example 8), 25 parts (Comparative Example 4), or 110 parts (Comparative Example 5) of PPSK per 100 parts of PPS.

The results of the foregoing Examples and Comparative Examples are shown in Table 1 below.

TABLE 1

| Example No. | Resin Composition | | | | Solvent | Method of Metallizing | Plate Adhesion |
| --- | --- | --- | --- | --- | --- | --- | --- |
| | PPS | PPSK | Polystyrene | Glass Fiber | | | |
| Example 1 | 100 | 43 | 0 | 0 | concentrated sulfuric acid | plating | 10 |
| Example 2 | 100 | 67 | 0 | 0 | " | " | 10 |
| Example 3 | 100 | 82 | 0 | 120 | " | " | 10 |
| Example 4 | 100 | 67 | 0 | 0 | trifluoromethane-sulfonic acid | " | 10 |
| Example 5 | 100 | 43 | 0 | 0 | concentrated sulfuric acid | ion sputtering | 10 |
| Example 6 | 100 | 67 | 0 | 0 | " | " | 10 |
| Example 7 | 100 | 35 | 0 | 0 | " | plating | 10 |
| Example 8 | 100 | 95 | 0 | 0 | " | " | 10 |
| Compara. Example 1 | 100 | 0 | 0 | 0 | " | " | 0 |
| Compara. Example 2 | 100 | 11 | 0 | 0 | " | " | 0 |
| Compara. Example 3 | 100 | 0 | 67 | 0 | toluene | " | 0 |
| Compara. Example 4 | 100 | 25 | 0 | 0 | concentrated sulfuric acid | " | 2 |
| Compara. Example 5 | 100 | 110 | 0 | 0 | " | " | 6 |

As described and demonstrated above, the method for surface toughening according to the present invention provides a roughened surface excellent in adhesion to a metallic deposit. Besides, having excellent heat resistance, PPSK introduced causes no impairment of heat resistant properties of the PPS resin molded article. Thus, the metallized products obtained by metallizing the surface-roughened resin molded article can be used in many fields of substitutes for metallic parts, printed circuit boards, etc.

While the invention has been described in detail and with reference to specific examples thereof, it will be apparent to one skilled in the art that various changes and modifications can be made therein without departing from the spirit and scope thereof.

What is claimed is:

1. A method for roughening the surface of a resin molded article to make it susceptible to metallizing, which comprises contacting a resin molded article, wherein at least the surface of the article to be toughened comprises 100 parts by weight of a polyphenylene sulfide resin and from 30 to 100 parts by weight of a polyphenylene sulfide ketone resin, with a solvent capable of dissolving a polyphenylene sulfide ketone resin more than a polyphenylene sulfide resin.

2. A method as claimed in claim 1, wherein said solvent is selected from the group consisting of concentrated sulfuric acid, methanesulfonic acid, trifluoromethanesulfonic acid, and trichloromethanesulfonic acid.

3. A method for metallizing a resin molded article which comprises contacting a resin molded article, wherein at least the surface of the article to be toughened comprises 100 parts by weight of a polyphenylene sulfide resin and from 30 to 100 parts by weight of a polyphenylene sulfide ketone resin, with a solvent capable of dissolving a polyphenylene sulfide ketone resin more than a polyphenylene sulfide resin, and then metallizing the toughened surface.

* * * * *